United States Patent
Yang

(10) Patent No.: US 9,959,938 B2
(45) Date of Patent: May 1, 2018

(54) SEMICONDUCTOR MEMORY DEVICE OUTPUTTING STATUS FAIL SIGNAL AND OPERATING METHOD THEREOF

(71) Applicant: SK hynix Inc., Gyeonggi-do (KR)

(72) Inventor: Chan Woo Yang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 224 days.

(21) Appl. No.: 14/845,793

(22) Filed: Sep. 4, 2015

(65) Prior Publication Data

US 2016/0293275 A1    Oct. 6, 2016

(30) Foreign Application Priority Data

Mar. 31, 2015  (KR) ................ 10-2015-0045328

(51) Int. Cl.
| | |
|---|---|
| G11C 29/00 | (2006.01) |
| G11C 29/50 | (2006.01) |
| G11C 29/42 | (2006.01) |
| G11C 29/44 | (2006.01) |
| G11C 16/34 | (2006.01) |
| G11C 29/56 | (2006.01) |

(52) U.S. Cl.
CPC ........ *G11C 29/50004* (2013.01); *G11C 29/42* (2013.01); *G11C 29/44* (2013.01); *G11C 16/3454* (2013.01); *G11C 29/56008* (2013.01); *G11C 2029/5004* (2013.01)

(58) Field of Classification Search
CPC ..... G11C 29/5004; G11C 29/42; G11C 29/44; G11C 16/3454; G11C 29/56008; G11C 2029/5004

USPC ....... 714/718, 745, 704, 719, 721, 723, 733, 714/734, 763, 799, 813, 824; 365/200, 365/201; 324/522, 523, 527, 759, 765

See application file for complete search history.

(56) References Cited

U.S. PATENT DOCUMENTS

| | | | | | |
|---|---|---|---|---|---|
| 4,860,259 | A | * | 8/1989 | Tobita ................... | G11C 29/34 365/189.04 |
| 5,034,923 | A | * | 7/1991 | Kuo ....................... | G11C 29/02 365/154 |
| 5,337,318 | A | * | 8/1994 | Tsukakoshi ........... | G11C 29/56 714/704 |
| 5,488,578 | A | * | 1/1996 | Yamada ................. | G11C 29/38 365/154 |
| 5,673,270 | A | * | 9/1997 | Tsujimoto .............. | G11C 29/38 365/189.05 |

FOREIGN PATENT DOCUMENTS

| | | |
|---|---|---|
| KR | 100875539 | 12/2008 |
| KR | 1020130030099 | 3/2013 |
| KR | 1020140006283 | 1/2014 |

* cited by examiner

*Primary Examiner* — Christine T. Tu
(74) *Attorney, Agent, or Firm* — IP & T Group LLP

(57) ABSTRACT

In a method of operating a semiconductor memory device, a program command is received, and a program operation is performed to increase threshold voltages of memory cells to be programmed by applying a program pulse to a word line. Page data is read from the selected memory cells by applying a verification voltage to the word line, and it is determined whether the number of memory cells corresponding to a program pass is greater than a determined number, based on the page data. A status fail signal is output based on the determination result.

9 Claims, 8 Drawing Sheets

SEMICONDUCTOR MEMORY DEVICE OUTPUTTING STATUS FAIL SIGNAL AND OPERATING METHOD THEREOF

CROSS-REFERENCE TO RELATED APPLICATION

The present application claims priority to Korean patent application number 10-2015-0045328, filed on Mar. 31, 2015, the entire disclosure of which is herein incorporated by reference in its entirety.

BACKGROUND

Field of Invention

An embodiment of the present invention relates to an electronic device, and more particularly, to a semiconductor memory device and an operating method thereof.

Description of Related Art

A semiconductor memory device uses semiconductors such as silicon (Si), germanium (Ge), gallium arsenide (GaAs), or indium phosphide (InP). Semiconductor memory devices are generally classified into volatile memory devices and nonvolatile memory devices.

Volatile memory devices are unable to retain their data without a constant source of power. Examples of volatile memory include static random access memory (SRAM), dynamic RAM (DRAM), synchronous DRAM (SDRAM), and the like. Nonvolatile memory devices are able to retain their data even without a constant source of power. Examples of nonvolatile memory include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), and the like. Flash memory is generally classified into NOR and NAND type flash memory.

SUMMARY

Embodiments provide a semiconductor memory device having improved reliability and a memory system including the same.

One embodiment includes a method of operating a semiconductor memory device, the method including: receiving a program command; performing a program operation to increase threshold voltages of memory cells to be programmed among selected memory cells by applying a program pulse to a word line; reading page data from the selected memory cells by applying a verification voltage to the word line; firstly determining whether the number of memory cells corresponding to a program pass among the selected memory cells is greater than a determined number, based on the page data; and outputting a status fail signal based on the first determination result.

The outputting of the status fail signal may be performed when the number of memory cells corresponding to the program pass among the selected memory cells is greater than the determined number.

The method may further include performing the program operation again when the number of memory cells corresponding to the program pass is less than or equal to the determined number.

The method may further include, after the program operation is again performed, reading second page data from the selected memory cells by applying the verification voltage to the word line; and secondly determining whether the number of memory cells corresponding to the program pass is greater than or equal to a critical value, based on the second page data; and outputting a program completion signal based on the second determination result.

The outputting of the program completion signal may be performed when the number of memory cells corresponding to the program pass among the selected memory cells based on the second page data is greater than or equal to the critical value.

the performing of the program operation again, the reading of the second page data, and the secondly determining may be repeated until the number of memory cells corresponding to the program pass based on the second page data is greater than or equal to the critical value.

The determined number may be smaller than the critical value.

The first determining may include generating pass/fail bits indicating whether each of the selected memory cells corresponds to the program pass, based on the page data.

The first determining may further include enabling a sensing signal according to whether the number of data bits having a first logic value among the pass/fail bits is greater than the determined number.

The outputting of the status fail signal may include outputting the status fail signal according to the sensing signal.

According to another aspect of the present invention, there is provided a method of operating a semiconductor memory device, the method including: receiving a program command; performing a program operation to increase threshold voltages of memory cells to be programmed among selected memory cells by applying a program pulse to a word line; reading the selected memory cells by applying a verification voltage to the word line; determining whether the number of memory cells having threshold voltages higher than the verification voltage among the selected memory cells is greater than a determined number; and outputting a status fail signal based on the determination result.

According to an aspect of the present invention, there is provided a semiconductor memory device including: a plurality of memory cells connected to a plurality of word lines; and a peripheral circuit suitable for performing a program operation on selected memory cells by applying a program pulse to one word line among the plurality of word lines in response to a program command, and reading page data from the selected memory cells by applying a verification voltage to the word line, wherein the peripheral circuit determines whether the number of memory cells corresponding to a program pass among the selected memory cells is greater than a determined number, based on the page data, and outputs a status fail signal based on the determination result.

According to the present invention, it is possible to provide a semiconductor memory device having improved reliability and a memory system including the same.

BRIEF DESCRIPTION OF THE DRAWINGS

Embodiments will now be described more fully hereinafter with reference to the accompanying drawings. However, the invention may be embodied in different forms and should not be construed as limited to the embodiments set forth herein. Rather, these embodiments are provided so that this disclosure will be thorough and complete, and will fully convey the scope of the invention to those skilled in the art.

In the drawings, dimensions may be exaggerated for clarity. It is to be understood that when an element is referred to as being "between" two elements, it can be the only element between the two elements, or one or more intervening elements may also be present. Like reference numerals refer to like elements throughout.

DETAILED DESCRIPTION

In the following detailed description, only a few embodiments of the present invention have been shown. As those skilled in the art would realize, the described embodiments may be modified in various ways, all without departing from the spirit or scope of the present invention. Accordingly, the drawings and description are to be regarded as illustrative in nature and not restrictive.

In the specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that one more elements may be present.

Figure 1:
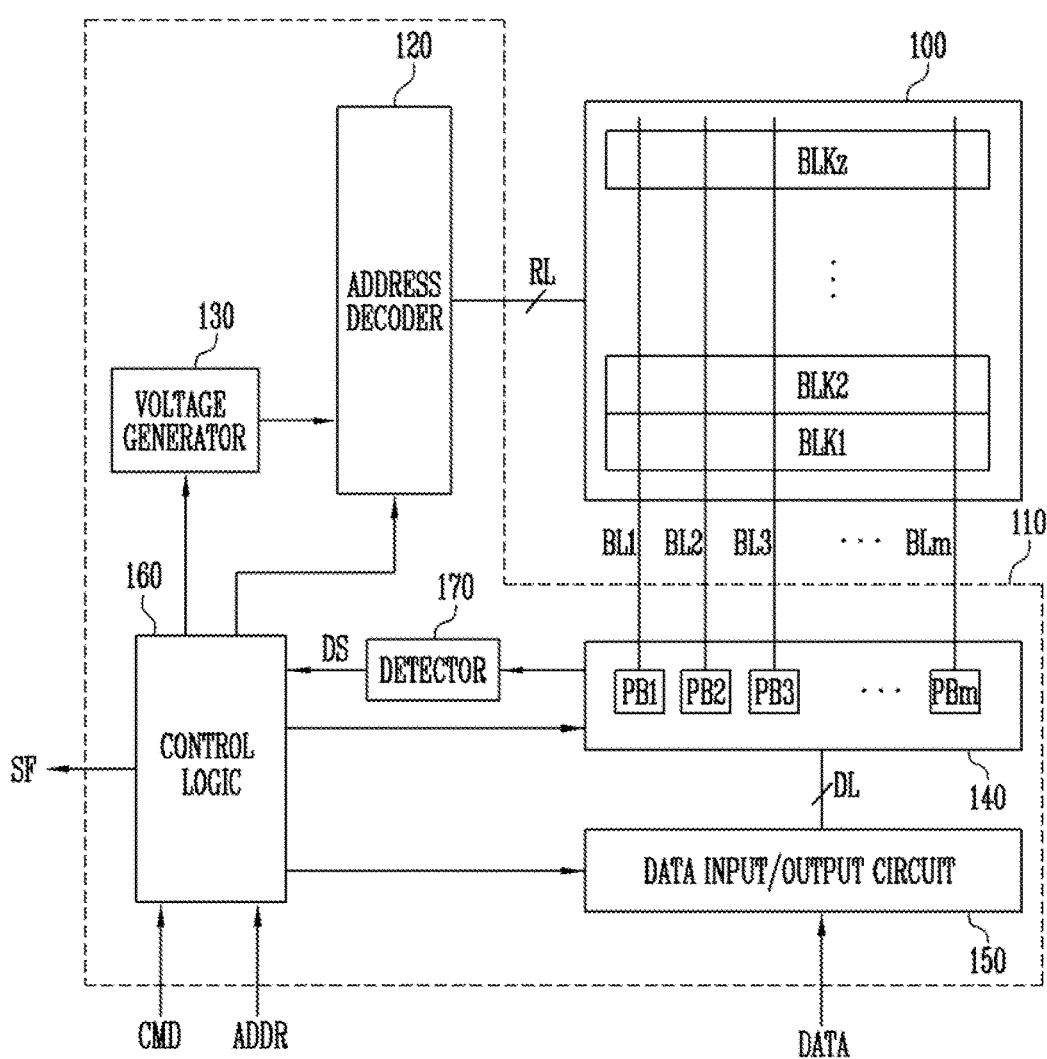
FIG. 1 is a block diagram illustrating a semiconductor memory device according to an embodiment of the present invention.
Figure 2:
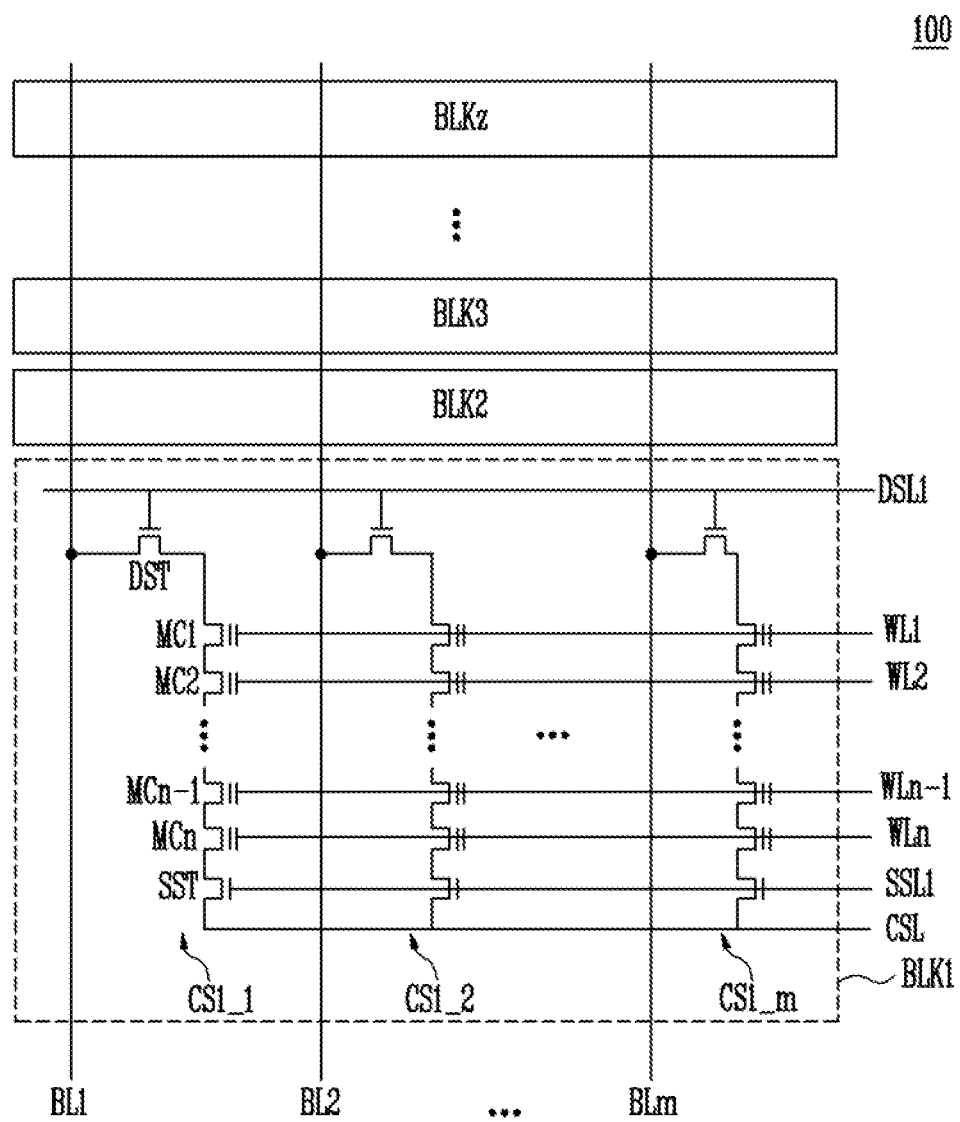
FIG. 2 is a block diagram illustrating a memory cell array of FIG. 1.

FIG. 1 is a block diagram illustrating a semiconductor memory device 50 according to an embodiment of the present invention. FIG. 2 is a block diagram illustrating a memory cell array 100 of FIG. 1.

Referring to FIG. 1, the semiconductor memory device 50 may include the memory cell array 100 and a peripheral circuit 110.

The memory cell array 100 may include a plurality of memory blocks BLK1 to BLKz. The plurality of memory blocks BLK1 to BLKz may be connected to an address decoder 120 through row lines RL and connected to a read/write circuit 140 through bit lines BL1 to BLm. Each of the plurality of memory blocks BLK1 to BLKz may include a plurality of memory cells. In an embodiment, the plurality of memory cells may be nonvolatile memory cells.

Referring to FIG. 2, first to zth memory blocks BLK1 to BLKz may be commonly connected to first to mth bit lines BL1 to BLm. In FIG. 2, for convenience, elements included in the first memory block BLK1 are illustrated, and elements included in each of the other memory blocks BLK2 to BLKz are omitted. It will be understood that each of the other memory blocks BLK2 to BLKz may be the same as the first memory block BLK1.

The memory block BLK1 may include a plurality of cell strings CS1_1 to CS1_m. First to mth cell strings CS1_1 to CS1_m may be connected to the first to mth bit lines BL1 to BLm, respectively.

Each of the plurality of first to mth cell strings CS1_1 to CS1_m may include a drain select transistor DST, a plurality of memory cells MC1 to MCn connected in series, and a source select transistor SST. The drain select transistor DST may be connected to a drain select line DSL1. First to nth memory cells MC1 to MCn may be connected to first to nth word lines WL1 to WLn. The source select transistor SST may be connected to a source select line SSL1. A drain of the drain select transistor DST may be connected to a corresponding bit line. The drain select transistors of the first to mth cell strings CS1_1 to CS1_m may be connected to the first to mth bit lines BL1 to BLm. A source of the source select transistor SST may be connected to a common source line CSL. In an embodiment, the common source line CSL may be commonly connected to the first to zth memory blocks BLK1 to BLKz.

The drain select line DSL1, the first to nth word lines WL1 to WLn, and the source select line SSL1 may be included in the row lines RL of FIG. 1. The drain select line DSL1, the first to nth word lines WL1 to WLn, and the source select line SSL1 may be controlled by the address decoder 120. The common source line CSL1 may be controlled by a control logic 160. The first to mth bit lines BL1 to BLm may be controlled by the read/write circuit 140.

Referring back to FIG. 1, the peripheral circuit 110 may include the address decoder 120, a voltage generator 130, the read/write circuit 140, a data input/output circuit 150, the control logic 160, and a detector 170.

The address decoder 120 may be connected to the memory cell array 100 through the row lines RL. The address decoder 120 may operate in response to control of the control logic 160.

The address decoder 120 receives an address ADDR through the control logic 160. Programming of the semiconductor memory device 50 may be performed in units of word lines. When the programming is performed, the address ADDR may include a block address and a row address.

The address decoder 120 may decode the block address in the received address ADDR. The address decoder 120 may select one memory block among the memory blocks BLK1 to BLKz according to the decoded block address.

The address decoder 120 may decode the row address in the received address ADDR. The address decoder 120 may select one word line of the selected memory block by applying voltages received from the voltage generator 130 to the row lines RL according to the decoded row address. During the program operation, the address decoder 120 may apply a program pulse to the selected word line, and apply a pass pulse lower than the program pulse to unselected word lines. During the program verification operation, the address decoder 120 may apply a verification voltage to the selected word line, and apply a verification pass voltage higher than the verification voltage to the unselected word lines.

In an embodiment, the address decoder 120 may include an address buffer, a block decoder, a row decoder, and the like.

The voltage generator 130 may generate a plurality of voltages by using an external power voltage supplied to the semiconductor memory device 50. The voltage generator 130 may operate in response to control of the control logic 160.

In an embodiment, the voltage generator 130 may generate an internal power voltage by regulating the external power voltage. The internal power voltage generated by the voltage generator 130 may be used as an operating voltage of the semiconductor memory device 50.

In an embodiment, the voltage generator 130 may generate a plurality of voltages by using the external power voltage and the internal power voltage. For example, the voltage generator 130 may include a plurality of pumping capacitors which receive the internal power voltage. The voltage generator 130 may generate a plurality of voltages by selectively activating the plurality of pumping capacitors in response to the control of the control logic 160. The generated voltages may be applied to the word lines by the address decoder 120. During the program operation, the voltage generator 130 may generate a high-voltage program pulse and a pass pulse lower than the program pulse. During the program verification operation, the voltage generator 130 may generate a verification voltage and a verification pass voltage higher than the verification voltage.

The read/write circuit 140 may include first to mth page buffers PB1 to PBm. The first to mth page buffers PB1 to PBm may be connected to the memory cell array 100 through the respective first to mth bit lines BL1 to BLm. The first to mth page buffers PB1 to PBm may operate in response to control of the control logic 160.

The first to mth page buffers PB1 to PBm may communicate data with the data input/output circuit 150. During the program operation, the first to mth page buffers PB1 to PBm may receive data DATA to be stored through the data input/output circuit 150 and the data lines DL. When a program pulse is applied to the selected word line, the first to mth page buffers PB1 to PBm may transmit the data DATA to be stored to the selected memory cells through the bit lines BL1 to BLm. A memory cell connected to a bit line, to which a program permission voltage (e.g., a ground voltage) is applied, may have an increased threshold voltage. The threshold voltage of a memory cell connected to a bit line, to which a program prohibition voltage (e.g., a power voltage) is applied may be maintained. During the program verification operation, the first to mth page buffers PB1 to PBm may read page data from the selected memory cells through the bit lines BL1 to BLm.

In an embodiment, the read/write circuit 140 may include a column select circuit.

The data input/output circuit 150 may be connected to the first to mth page buffers PB1 to PBm through the data lines DL. The data input/output circuit 150 may operate in response to control of the control logic 160. During the program operation, the data input/output circuit 150 receives data DATA to be stored from an external controller (not shown).

The control logic 160 may be connected to the address decoder 120, the voltage generator 130, the read/write circuit 140, the data input/output circuit 150, and the detector 170. The control logic 160 may receive a command CMD and an address ADD from the external controller. The control logic 160 may control the address decoder 120, the voltage generator 130, the read/write circuit 140, the data input/output circuit 150, and the detector 170 in response to the command CMD. The control logic 160 may transmit the address ADDR to the address decoder 120.

The detector 170 may be connected to the read/write circuit 140 and the control logic 160. The detector 170 may operate in response to control of the control logic 160.

According to the embodiment of the present invention, when a command CMD (hereinafter, referred to as a program command) indicating a program is received, the peripheral circuit 110 may perform one or more program operations on selected memory cells. Subsequently, the peripheral circuit 110 may determine whether the number of memory cells corresponding to a program pass among the selected memory cells is greater than a determined number. According to the determination result, the peripheral circuit 110 may output a status fail signal SF without again performing the program operation in an increment step pulse program (ISPP) manner.

After the one or more program operations are performed, the program verification operation may be performed. During the program verification operation, page data read from the selected memory cells may be stored in the first to mth page buffers PB1 to PBm. The first to mth page buffers PB1 to PBm may generate, in response to control of the control logic 160, pass/fail bits indicating whether data bits of the page data are the same as data bits of data DATA to be stored. The pass/fail bits indicate whether the selected memory cells reach a desired voltage state. The generated pass/fail bits may be transmitted to the detector 170.

The detector 170 may enable a sensing signal DS when the number of data bits corresponding to the program pass among the pass/fail bits is greater than the determined number. The detector 170 may disable the sensing signal DS when the number of data bits corresponding to the program pass among the pass/fail bits is less than or equal to the determined number.

When the sensing signal DS is enabled, the control logic 160 outputs the status fail signal SF without again performing the program operation. The semiconductor memory device 50 may terminate the program operation corresponding to the program command CMD. The external controller may recognize, based on the status fail signal SF, that the data DATA to be stored is not stored in the semiconductor memory device 50. Subsequently, the external controller may control the semiconductor memory device 50 to program the data DATA to be stored in other memory cells.

Figure 3:
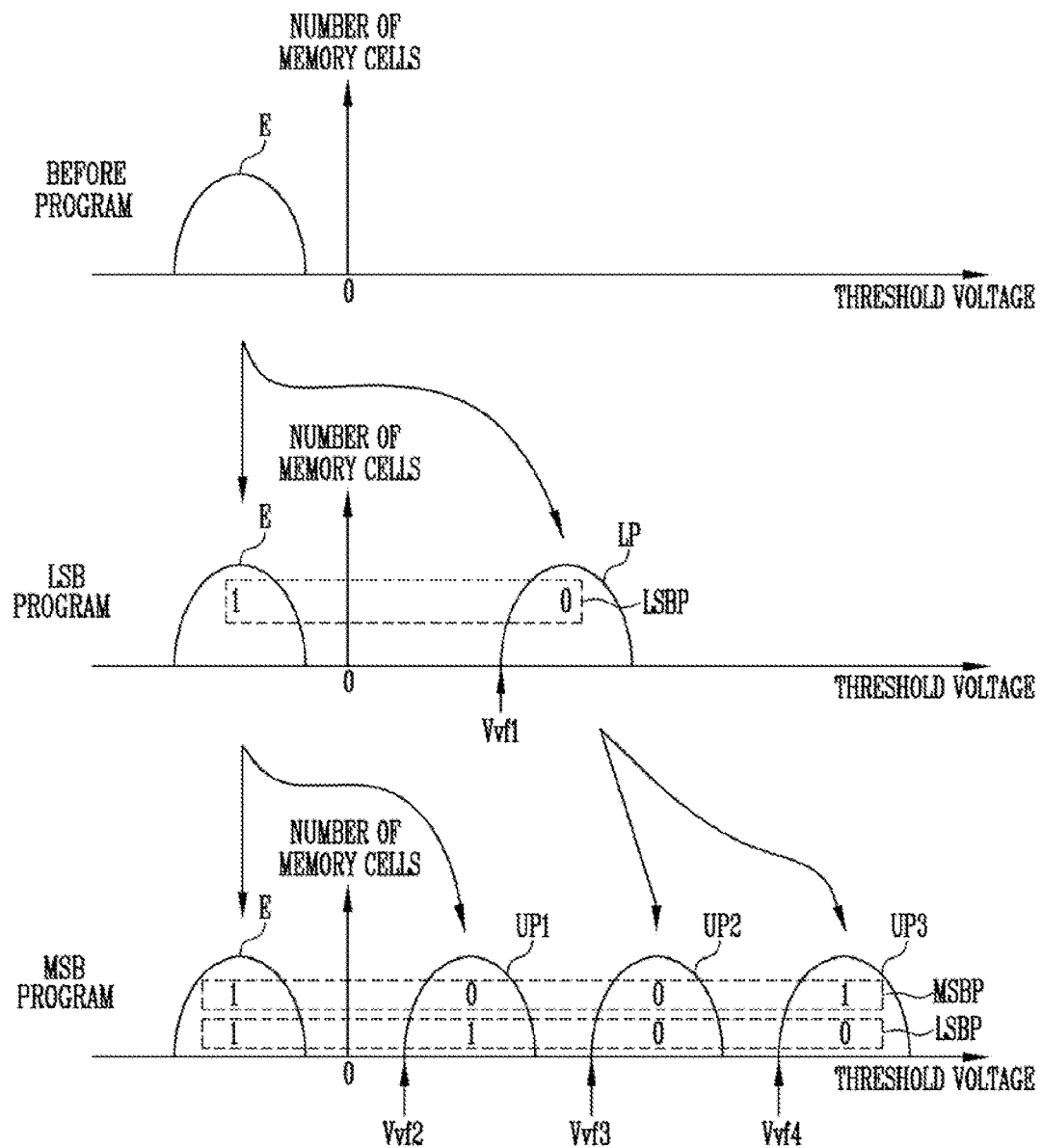
FIG. 3 is a diagram illustrating threshold voltage distributions of memory cells having a least significant bit (LSB) and a most significant bit (MSB).

FIG. 3 is a diagram illustrating threshold voltage distributions of memory cells having a least significant bit (LSB) and a most significant bit (MSB). In FIG. 3, the horizontal axis represents threshold voltages, and the vertical axis represents the number of memory cells.

Referring to FIG. 3, selected memory cells have an erase state E before the program operation. For example, a voltage range corresponding to the erase state E may be lower than the ground voltage. In an embodiment, it may be defined that the memory cells in the erase state E store a logic value of "1."

During the LSB program operation, the memory cells in the erase state E may be programmed to have the erase state E or a lower program state (LP) according to data DATA to be stored.

During the program operation, the threshold voltages of memory cells to be programmed to the lower program state LP increase, and then during the program verification operation, it may be determined whether the threshold voltages of the memory cells to be programmed are higher than a first verification voltage Vvf1. Among the memory cells to be programmed, memory cells having threshold voltages higher than the first verification voltage Vvf1 correspond to the program pass. Among the memory cells to be programmed, memory cells having threshold voltages less than or equal to the first verification voltage Vvf1 correspond to the program fail. If there are memory cells corresponding to the program fail, the program operation may be performed again. The program operation and the verification operation may be repeated until there are no more program failed memory cells. That is, the program operation with respect to the lower program state LP and the verification operation with respect to the first verification voltage Vvf1 may be repeated, thereby performing the LSB program operation.

During the LSB program operation, one data bit may be stored in each memory cell, so that one LSB page LSBP may be stored in the selected memory cells. In an embodiment, it may be defined that the memory cells in the erase state E store the logic value of "1," and the memory cells in the lower program state LP store a logic value of "0."

After the LSB program operation, the MSB program may be performed. According to data DATA to be stored, the memory cells in the erase state E and the lower program state LP may be programmed to have the erase state E and first to third upper program states UP1 to UP3. For example, a memory cell in the erase state E may be programmed to have one of the erase state E and the first upper program state UP1, and a memory cell in the lower program state LP may be programmed to have one of the second upper program state UP2 and the third upper program state UP3. To this end, a voltage between the erase state E and the lower program state LP may be applied to a selected word line such that data of the LSP page LSBP may be read, and the MSB program operation may be performed with reference to the read data and the data DATA to be stored. A program operation and verification operations using second to fourth verification voltages Vvf2 to Vvf4 may be repeatedly performed, thereby performing the MSB program operation.

Accordingly, a MSB page MSBP may be additionally stored in the selected memory cells. Two data bits may be stored in each memory cell, so that the LSB page LSBP and the MSB page MSBP may be defined in the selected memory cells.

In an embodiment, the erase state E may correspond to data of "11," the first upper program state UP1 may correspond to data of "01," the second upper program state UP2 may correspond to data of "00," and the third upper program state UP3 may correspond to data of "10." That is, the least significant bits LSBP in the erase state E and the first to third upper program states UP1 to UP3 may be defined as "1," "1," "0," and "0," respectively, and the most significant bits MSBP in the erase state E and the first to third upper program states UP1 to UP3 may be defined as "1," "0," "0," and "1," respectively.

It is assumed that, after the LSB program operation is performed on memory cells, the LSB program operation for the same memory cells is commanded. That is, a program command CMD, an address ADDR indicating an LSB page of the same memory cells, and data DATA to be stored may be received after the LSB program operation. The semiconductor memory device 50 may perform the LSB program operation even though the selected memory cells already have the erase state E and the lower program state LP according to the previous LSB program operation. That is, the LSB program may be repeatedly performed on the same memory cells. In this case, the data of the LSB page LSBP, already stored in the selected memory cells, may be damaged. The damage of the data may be detected when data of the selected memory cell of the repeated LSB program are read and decoded according to an error correction code that may be performed on the read data. Therefore, the reliability of the semiconductor memory cell 50 may be degraded.

It is assumed that, after the MSB program operation is performed on memory cells, the MSB program operation for the same memory cells is commanded. The semiconductor memory device 50 may perform the MSB program operation even though the selected memory cells already have the erase state E and the first to third upper program states UP1 to UP3 according to the previous MSB program operation. In this case, the LSB page LSBP and the MSB page MSBP, which are already stored in the selected memories, may be damaged.

Figure 4:
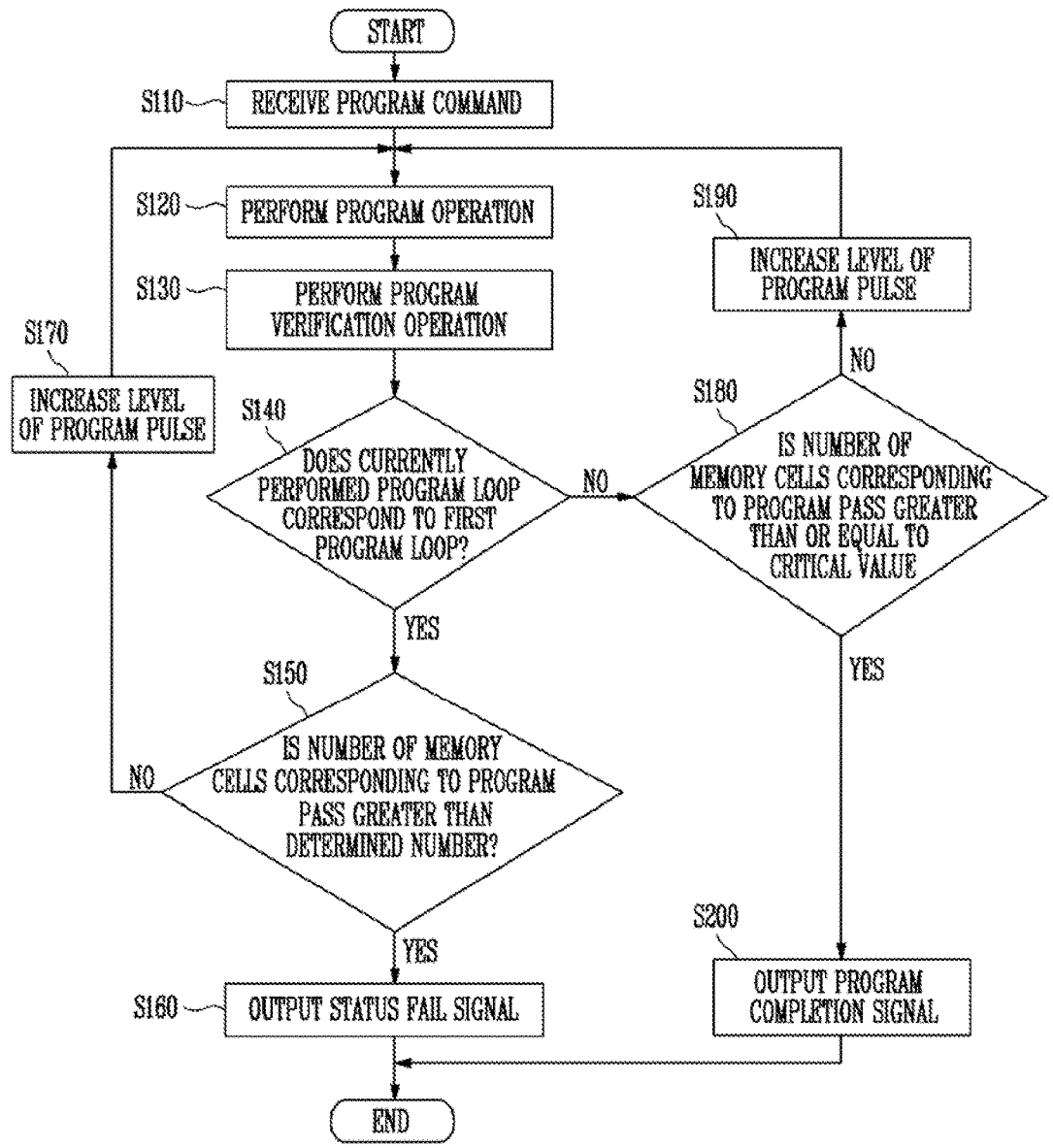
FIG. 4 is a flowchart illustrating a method of programming the semiconductor memory device according to an embodiment of the present invention.

FIG. 4 is a flowchart illustrating a method of programming the semiconductor memory device 50 according to an embodiment of the present invention.

Referring to FIGS. 1 and 4, at step S110, a program command CMD may be received. The program command CMD, an address ADDR indicating selected memory cells, and data DATA to be stored may be received. The data DATA to be stored may be stored in the first to mth page buffers PB1 to PBm.

At step S120, a program operation may be performed. The address decoder 120 may apply a program pulse to a selected word line. The first to mth page buffers PB1 to PBm may bias each of the first to mth bit lines BL1 to BLm to a program permission voltage (e.g., a ground voltage) or a program prohibition voltage (e.g., a power voltage) according to the data DATA to be stored. The threshold voltages of memory cells connected to bit lines to which the program permission voltage is applied may increase. The threshold voltages of memory cells connected to bit lines to which the program prohibition voltage is applied may be maintained.

At step S130, one or more program verification operations may be performed. The address decoder 120 may apply a verification voltage to the selected word line. The first to mth page buffers PB1 to PBm may read page data from memory cells selected through the first to mth bit lines BL1 to BLm. The first to mth page buffers PB1 to PBm may detect whether the threshold voltages of the selected memory cells are higher than the verification voltage, and store the page data based on the detection result.

Each page buffer may determine whether a memory cell has a desired voltage state based on the data bits of the read page data, and generate the pass/fail bit based on the determination result. The pass/fail bit may indicate which one of the program pass and program fail the memory cell corresponds to.

During the LSB program operation, the first to mth page buffers PB1 to PBm may determine whether each bit of the page data is the same as a corresponding bit of the data DATA to be stored, and generate a pass/fail bit based on the determination result. For example, when a first bit of the page data is the same as a corresponding bit of the data DATA to be stored, the pass/fail bit indicating the program pass may be generated. When the first bit of the page data is not the same as corresponding bit of the data DATA to be stored, the pass/fail bit indicating the program fail may be generated. The pass/fail bit indicating the program pass may have, for example, the logic value of "1." The pass/fail bit indicating the program fall may have, for example, the logic value of "0."

During the MSB program operation, it will be understood that the plurality of program verification operations may be performed at step S130. The verification operations may be performed on the selected memory cells by using the second to fourth verification voltages Vvf2 to Vvf4. Each page buffer may determine whether a memory cell has a desired voltage state based on the data bits of the read page data according to the program verification operations, and generate the pass/fail bit based on the determination result.

Among the generated pass/fail bits, the number of pass/fail bits indicating the program pass may represent the number of memory cells corresponding to the program pass among the selected memory cells.

Steps S120 and S130 may be included in one program loop.

At step S140, it may be determined whether a currently performed program loop is a first program loop. Step S150 or S170 may be performed based on the determination result.

At step S150, it may be determined whether the number of selected memory cells corresponding to the program pass is greater than a determined number.

The detector 170 may receive pass/fail bits from the first to mth page buffers PB1 to PBm, and compare the number of data bits indicating the program pass among the pass/fail bits with a determined number. In an embodiment, the detector 170 may count data bits having the logic value of "1" among the pass/fail bits, and compare the counted value with the determined number. As another embodiment, the detector 170 may include an analog circuit, reflect data bits having the logic value of "1" to comparison impedance, and compare the comparison impedance with impedance corresponding to the determined number.

The determined number may be previously set. In an embodiment, meta information may be stored in a specific area in the memory cell array 100, and the meta information may be loaded to the control logic 160 during power-up of the semiconductor memory device 50. The determined number may be specified according to the loaded meta information.

The determined number may be changed depending on characteristics of data DATA to be stored. The data DATA to be stored may be randomized data, and therefore, it is assumed that the number of data bits having the logic value of "1" among the data DATA to be stored is similar to that of data bits having the logic value of "0" among the data DATA to be stored. In this case, when the LSB program operation is performed, the number of memory cells to be maintained in the erase state E may be similar to that of memory cells to be programmed to the lower program state LP. After an initial program pulse is applied, most of the memory cells to be programmed to the lower program state LP do not have sufficiently increased threshold voltages and therefore may correspond to the program fail. The memory cells to be maintained as erase state E may correspond to the program pass regardless of the application of the program pulse. This may mean that about a half of all of the selected memory cells correspond to the program pass, and the other memory cells correspond to the program fail. In this case, the determined number may be defined as the sum of the half number of the selected memory cells and a specific expectation. As an example, when the number of program (NOP) of one word line is 4, the number of selected memory cells may be a quarter of the total memory cells connected to the one word line, and the determined number may be defined as the sum of ⅛ of the total memory cells connected to the one word line and the specific expectation. As another example, when the number of program (NOP) of one word line is 1, the number of selected memory cells may be equal to that of the total memory cells connected to the one word line, and the determined number may be defined by the sum of a half of the total memory cells connected to the one word line and a specific expectation.

It is also assumed that number of memory cells of the erase state E and the first to third upper program states UP1 to UP3 are similar. During the MSB program operation, after an initial program pulse is applied, most of the memory cells to be programmed to the first to third upper program states UP1 to UP3 do not have sufficiently increased threshold voltages and therefore may correspond to the program fail. The memory cells to be maintained as erase state E may correspond to the program pass regardless of the application of the program pulse. This may mean that memory cells corresponding to about a quarter of all of the selected memory cells correspond to the program pass, and the other memory cells correspond to the program fail. In this case, the determined number may be defined as the sum of the quarter number of the selected memory cells and a specific expectation.

When the number of selected memory cells corresponding to the program pass is greater than the determined number after the initial program operation, the selected memory cells may have already been programmed. When the number of selected memory cells corresponding to the program pass is greater than the determined number, step S160 may be performed. When the number of selected memory cells corresponding to the program pass is less than or equal to the determined number, step S170 may be performed.

At step S160, a status fail signal SF may be output without performing any program operation.

At step S170, the control logic 160 may set the voltage generator 130 to increase the level of the program pulse. Subsequently, step S120 may be performed again. When step S120 is performed again, the program operation may be performed using the increased program pulse.

At step S180, it may be determined whether the number of selected memory cells corresponding to the program pass is greater than or equal to a critical value. The detector 170 may receive pass/fail bits from the first to mth page buffers PB1 to PBm, and compare the number of data bits indicating the program pass among the pass/fail bits with the critical value.

The critical value may be greater than the determined number. The critical value may be equal or similar to the number of selected memory cells. It is assumed that the critical value is the number of selected memory cells. When the number of selected memory cells corresponding to the program pass is equal to the critical value, all the selected memory cells may have desired voltage states.

At step S190, when the number of selected memory cells 1i corresponding to the program pass is smaller than the critical value, the control logic 160 may set the voltage generator 130 to increase the level of the program pulse. Subsequently, step S120 may be performed again.

At step S200, when the number of selected memory cells corresponding to the program pass is greater than or equal to the critical value, the control logic 160 may output a program completion signal.

According to the embodiment of the present invention, when the program command CMD is received, it may be determined whether the number of selected memory cells corresponding to the program pass is greater than the determined number after the initial program operation. According to the determination result, the status fail signal SF can be output without performing any subsequent program operation. Thus, the external controller (not shown) which controls the semiconductor memory device 50 can recognize that the program command has been repeatedly provided to the selected page.

Figure 5:
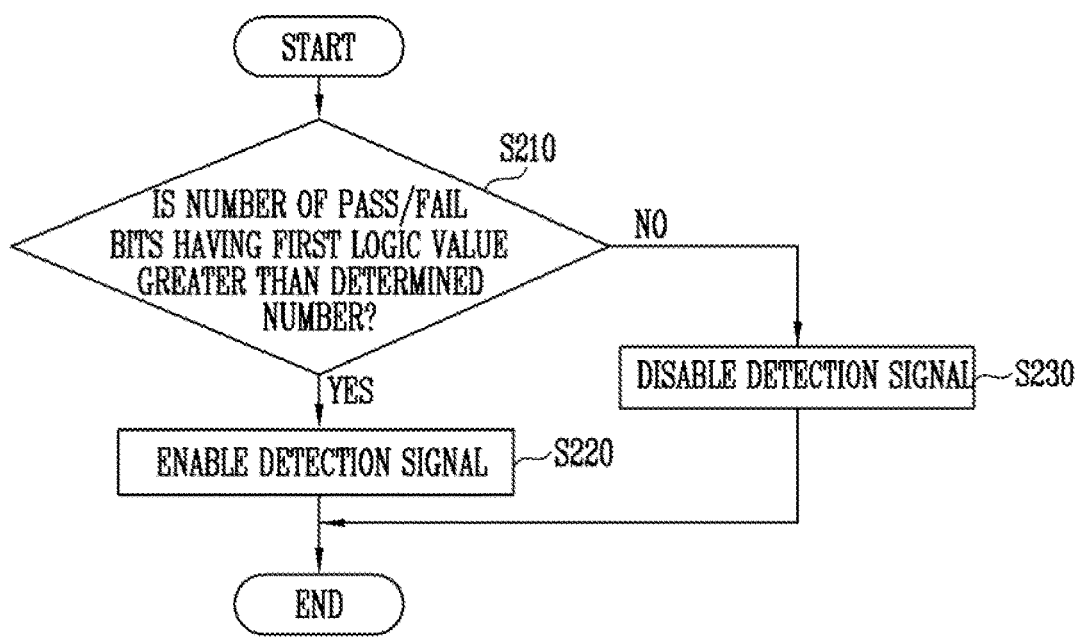
FIG. 5 is a flowchart illustrating step S150 of FIG. 4.

FIG. 5 is a flowchart illustrating an embodiment of step S150 of FIG. 4.

Referring to FIG. 5, at step S210, it may be determined that the number of pass/fail bits having a first logic value is greater than a determined number. The number of pass/fail bits having the first logic value may represent the number of selected memory cells corresponding to the program pass. When the number of pass/fail bits having the first logic value is greater than the determined value, step S220 may be performed. When the number of pass/fail bits having the first logic value is less than or equal to the determined value, step S230 may be performed.

At step S220, the sensing signal DS may be enabled. The control logic 160 may output the status fail signal SF in response to the enabled sensing signal DS. At step S230, the sensing signal DS may be disabled. When the sensing signal DS is disabled, the program of the selected memory cells may be performed again.

Figure 6:
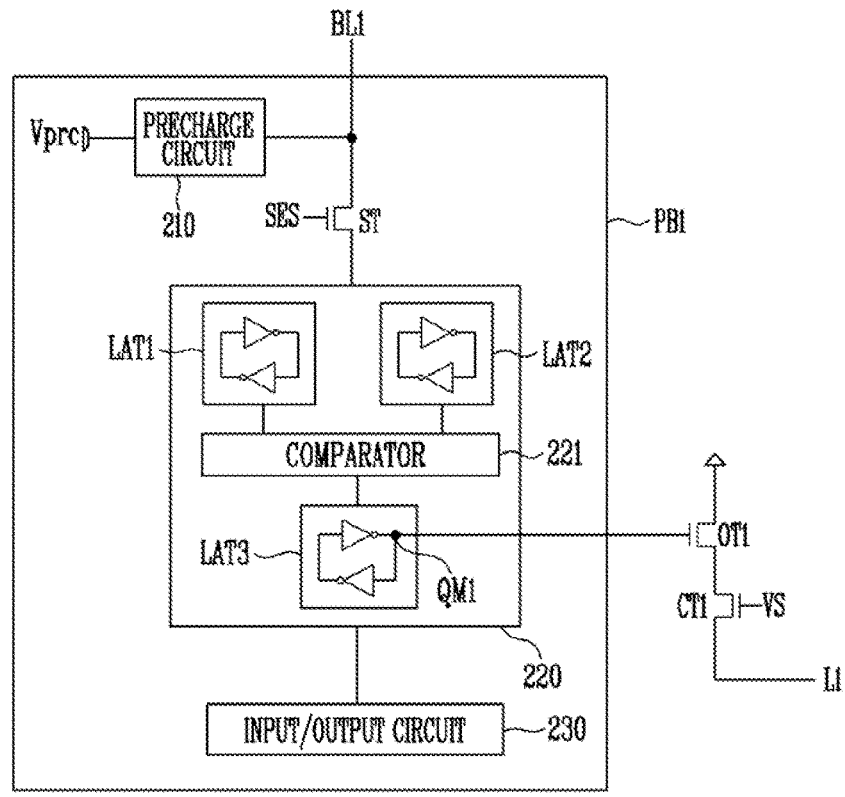
FIG. 6 is a block diagram illustrating a page buffer of FIG. 1, and an output transistor and a first control transistor, which correspond thereto.

FIG. 6 is a block diagram illustrating any one PB1 of the page buffers PB1 to PBm of FIG. 1, and an output transistor OT1 and a first control transistor CT1, which correspond thereto.

Referring to FIG. 6, the first page buffer PB1 may include a precharge circuit 210, a bit line select transistor ST, a sensing circuit 220, and an input/output circuit 230.

The precharge circuit 210 is connected to the first bit line BL1. During the program verification operation, the precharge circuit 210 may transmit a precharge voltage Vprc to the first bit line BL1 in response to control of the control logic 160. In an embodiment, the precharge circuit 210 may include a switching element which operates in response to the control of the control logic 160.

The bit line select transistor ST may be connected between the first bit line BL1 and the sensing circuit 220. The bit line select transistor ST may electrically connect the first bit line BL1 and the sensing circuit 220 to each other in response to a sensing signal SES from the control logic 160.

The sensing circuit 220 may be connected to the first bit line BL1 through the bit line select transistor ST. The sensing circuit 220 may include a plurality of latches LAT1 to LAT3 and a comparator 221. When the bit line select transistor ST is turned on during the program verification operation, the sensing circuit 220 may sense a voltage or current of the first bit line BL1, and store corresponding data in a first latch LAT1.

A second latch LAT2 may store a data bit indicating a voltage state which a corresponding memory cell is to have according to a program. The second latch LAT2 may store a data bit to be stored in the corresponding cell in data DATA to be stored.

The comparator 221 may determine whether the corresponding memory cell has a desired voltage state based on the data bits stored in the first latch LAT1 and the second latch LAT2, and generate the pass/fail bit based on the determination result. For example, the comparator 221 may generate the pass/fail bit by comparing the data bit stored in the first latch LAT1 with the data bit stored in the second latch LAT2. The generated pass/fail bit may be stored in a third latch LAT3.

The input/output circuit 230 may be connected to the sensing circuit 220. The input/output circuit 230 may output data of the first latch LAT1 to the data lines DL in response to control of the control logic 160.

The first output transistor OT1 and the first control transistor CT1 may be provided to the first page buffer PB1. The transistors OT1 and CT1 may be connected in series between a first line L1 and a reference node. A gate of the first output transistor OT1 may be connected to a first latch node QM1 in the third latch LAT3. A gate of the first control transistor CT1 may be connected to a control signal VS. The control signal VS may be provided from the control logic 160.

The first transistor OT1 may be turned on according to data latched to the first latch node QM1. For example, when the logic value of "1" is stored in the first latch node QM1, the first output transistor OT1 may be turned on. When the control signal VS is enabled such that the first transistor CT1 is turned on, the first line L1 may be electrically connected to the reference node. That is, when the control signal VS is enabled, the first line L1 may be electrically connected to the reference node according to the data of the first latch node QM1.

Like the first page buffer PB1, an output transistor and a control transistor may be provided to each of the second to mth page buffers PB2 to PBm. The output transistors and the control transistors may constitute a reflector. This will be described in detail with reference to FIG. 7.

Figure 7:
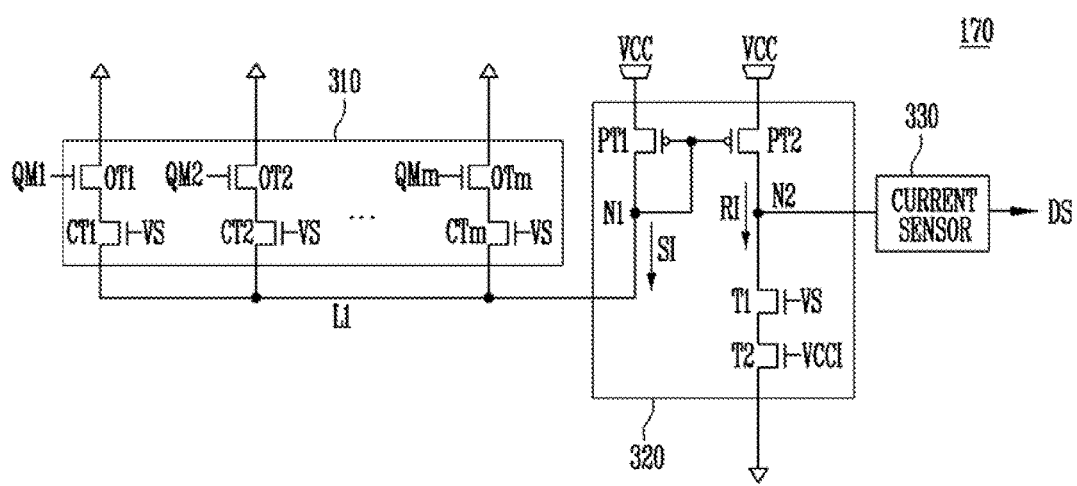
FIG. 7 is a circuit diagram illustrating an embodiment of a detector of FIG. 1.

FIG. 7 is a circuit diagram illustrating an embodiment of the detector 170 of FIG. 1.

Referring to FIGS. 1 and 7, the detector 170 may include a reflector 310, a current mirror 320, and a current sensor 330.

The reflector 310 may include first to mth output transistors OT1 to OTm and first to mth control transistors CT1 to CTm. The first to mth output transistors OT1 to OTm may be connected to first to mth latch nodes QM1 to QMm. The first to mth latch nodes QM1 to QMm may correspond to nodes of the third latches LAT3 in the first to mth page buffers PB1 to PBm, respectively. The first to mth output transistors QT1 to QTm may be turned on according to the pass/fail bits stored in the first to mth latch nodes QM1 to QMm, respectively.

Gates of the first to mth control transistors CT1 to CTm may be connected to the control signal VS. When the control signal VS is enabled, the first to mth control transistors CT1 to CTm may be turned on.

The first line L1 may be connected to the reference node through the reflector 310. The first line L1 may be connected to a power voltage VCC through the current mirror 320. When the control signal VS is enabled, impedance of the reflector 310 may be determined according to the pass/fail bits of the latch nodes QM1 to QMm. When the control signal VS is enabled, sensing current SI flowing through the first line L1 may be determined according to the impedance of the reflector 310. When the control signal VS is enabled, the reflector 310 may provide the sensing current SI according to the pass/fail bits of the latch nodes QM1 to QMm.

The current mirror 320 may include first and second PMOS transistors PT1 and PT2, and first and second transistors T1 and T2. The first PMOS transistor PT1 may be connected between the power voltage VCC and a first node N1. The first node N1 may be connected to the first line L1. A gate of the first PMOS transistor PT1 may be connected to a gate of the second PMOS transistor PT2, and also connected to the first node N1, i.e., a drain of the first PMOS transistor PT1. The second PMOS transistor PT2 may be connected between the power voltage VCC and a second node N2. The gate of the second PMOS transistor PT2 may be connected to the gate of the first PMOS transistor PT1.

The first and second transistors T1 and T2 may be connected in series between the second node N2 and the reference node. The first transistor T1 may be turned on in response to the control signal VS. The second transistor T2 may be turned on in response to a control signal VCC1.

According to the configuration described above, the sensing current SI may be reflected to reflection current RI. A voltage of the second node N2 may be determined according to impedance values of the first and second transistors T1 and T2.

It may be determined whether the number of pass/fail bits having the logic value "1" is smaller than the determined number by sensing the amount of the reflection current RI. The reflection current RI may be transmitted to the current sensor 330. The current sensor 330 senses the amount of the reflection current RI, thereby generating a sensing signal DS.

Figure 8:
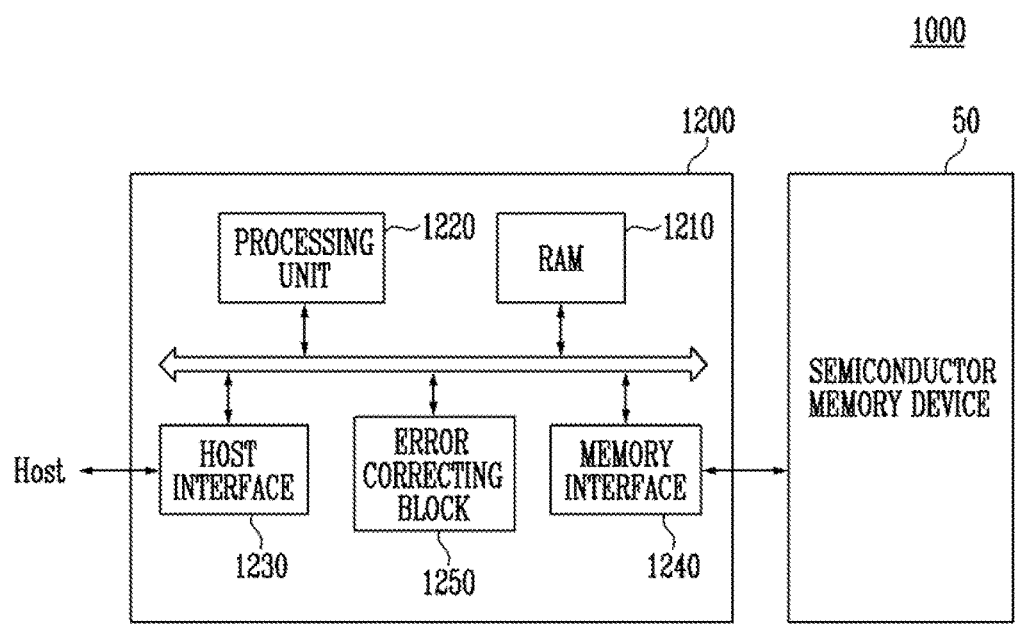
FIG. 8 is a block diagram illustrating a memory system including the semiconductor memory device of FIG. 1.

FIG. 8 is a block diagram illustrating a memory system 1000 including the semiconductor memory device 50 of FIG. 1.

Referring to FIG. 8, the memory system 1000 may include a semiconductor memory device 50 and a controller 1200.

The semiconductor memory device 50 may be configured and operated as described with reference to FIG. 1. Hereinafter, overlapping descriptions will be omitted.

The controller 1200 may be connected to a host Host and the semiconductor memory device 50. The controller 1200 may access the semiconductor memory device 50 in response to a request from the host Host. For example, the controller 1200 may control read, write, erase, and background operations of the semiconductor memory device 50. The controller 1200 may provide an interface between the semiconductor memory device 50 and the host Host. The controller 1200 may drive firmware for controlling the semiconductor memory device 50.

The controller 1200 may include a random access memory (RAM) 1210, a processing unit 1220, a host interface 1230, a memory interface 1240, and an error correcting block 1250.

The RAM 1210 may be used as one or more of an operation memory of the processing unit 1220, a cache memory between the semiconductor memory device 50 and the host Host, and a buffer memory between the semiconductor memory device 50 and the host Host.

The processing unit 1220 may control the general operation of the controller 1100.

The processing unit 1220 may randomize data received from the host Host. For example, the processing unit 1220 may randomize the data received from the host Host by using a randomizing seed. The randomized data may be provided as data DATA to be stored to the semiconductor memory device 50, to be programmed to the memory cell array 100.

The processing unit 1220 may de-randomize data received from the semiconductor memory device 50 during a read operation. For example, the processing unit 1220 may de-randomize the data received from the semiconductor memory device 50 by using a de-randomizing seed. The de-randomized data may be output to the host Host.

In an embodiment, the processing unit 1220 may perform randomizing and de-randomizing operations by driving software or firmware.

The host interface 1230 may include a protocol for exchanging data between the host Host and the controller 1200. In an embodiment, the controller 1200 may communicate with the host Host through one or more of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1240 may interface with the semiconductor memory device 50. For example, the memory interface 1240 may include a NAND interface or a NOR interface.

The error correcting block 1250 may detect and correct an error of data received from the semiconductor memory device 50 by using an error correcting code.

The controller 1200 and the semiconductor memory device 50 may be integrated into one semiconductor device. In an embodiment, the controller 1200 and the semiconductor memory device 50 may be integrated into one semiconductor device, to constitute a memory card. For example, the controller 1200 and the semiconductor memory device 50 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1200 and the semiconductor memory device 50 may be integrated into one semiconductor device to constitute a semiconductor drive or the solid state drive (SSD). The semiconductor drive SSD may include a storage device configured to store data in a semiconductor memory. When the memory system 1000 is used as the semiconductor drive SSD, the operating speed of the host Host connected to the memory system 1000 can be remarkably improved.

As another example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telemetics network, an RFID device, or one of various components that constitute a computing system.

In an embodiment, the semiconductor memory device 50 or the memory system 1000 may be packaged in various forms. For example, the semiconductor memory device 100 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 9:
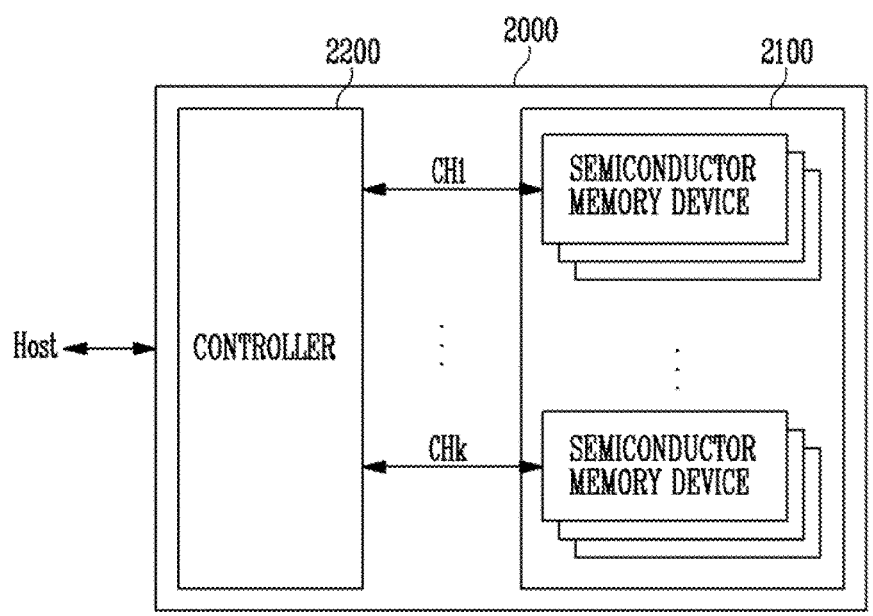
FIG. 9 is a block diagram illustrating an applied example of the memory system of FIG. 8.

FIG. 9 is a block diagram illustrating an applied example 2000 of the memory system 1000 of FIG. 8.

Referring to FIG. 9, the memory system 2000 may include a semiconductor memory device 2100 and a controller 2200. The semiconductor memory device 2100 may include a plurality of semiconductor memory chips. The plurality of semiconductor memory chips may be divided into a plurality of groups.

In FIG. 9, it is illustrated that the plurality of groups communicate with the controller 2200 through first to kth channels CH1 to CHk. Each semiconductor memory chip may be configured and operate like the semiconductor memory device 50 described with reference to FIG. 1.

Each group may communicate with the controller 2200 through one common channel. The controller 2200 may be configured similarly to the controller 1200 described with reference to FIG. 8. The controller 2200 may control the plurality of memory chips of the semiconductor memory device 2100 through the plurality of channels CH1 to CHk.

In FIG. 9, it has been illustrated that a plurality of semiconductor memory chips may be connected to one channel. However, it will be understood that the memory system 200 may be modified such that one semiconductor memory chip may be connected to one channel.

Figure 10:
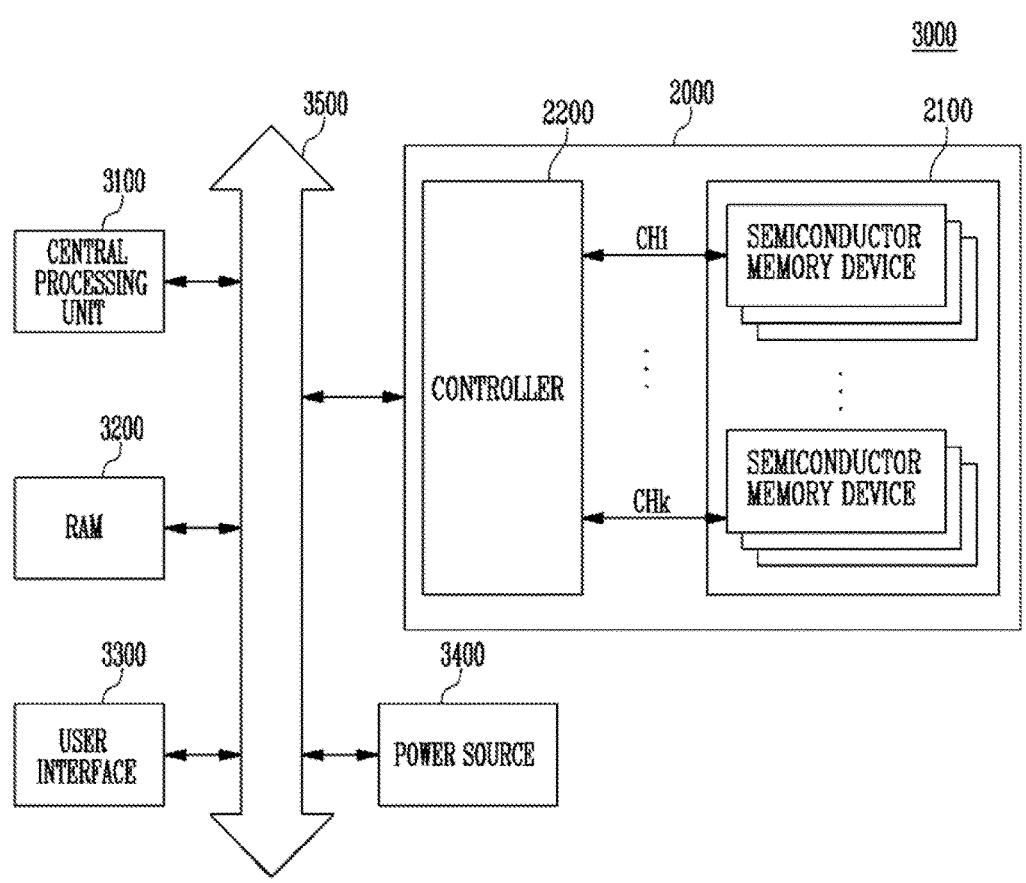
FIG. 10 is a block diagram illustrating a computing system including the memory system described with reference to FIG. 9.

FIG. 10 is a block diagram illustrating a computing system 3000 including the memory system 2000 described with reference to FIG. 9.

Referring to FIG. 10, the computing system 300 may include a central processing unit 3100, a random access memory (RAM) 3200, a user interface 3300, a power source 3400, a system bus 3500, and the memory system 2000.

The memory system 2000 may be electrically connected to the central processing unit 3100, the RAM 3200, the user interface 3300, and the power source 3400 through the system bus 3500. Data supplied through user interface 3300 or data processed by the central processing unit 3100 may be stored in the memory system 2000.

In FIG. 10, it is illustrated that the semiconductor memory device 2100 may be connected to the system bus 3500 through the controller 2200. However, the semiconductor memory device 2100 may be directly connected to the system bus 3500. In this case, the function of the controller 2200 may be performed by the central processing unit 3100 and the RAM 3200.

In FIG. 10, it is illustrated that the memory system 2000 described with reference to FIG. 9 may be provided. However, the memory system 2000 may be replaced by the memory system 1000 described with reference to FIG. 8. In an embodiment, the computing system 3000 may include both the memory systems 1000 and 2000 described with reference to FIGS. 8 and 9.

According to the embodiments of the present invention, it is possible to prevent a program from being repeatedly performed to selected memory cells. Thus, it is possible to provide a semiconductor memory device having improved reliability.

Embodiments have been disclosed herein, and although specific terms are employed, they are to be used and interpreted in a generic and descriptive sense only and not for limiting the scope of the invention. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A method of operating a semiconductor memory device, the method comprising:
   performing a program operation comprising a plurality of program loops, wherein each of the plurality of program loops includes a program voltage application operation and a program verification operation; and
   outputting, if a result of the program verification operation for a first program loop among the plurality of program loops is a pass, a status fail signal for the program operation,
   wherein the program voltage application operation comprises applying a program voltage pulse to a selected word line, and
   wherein the program verification operation comprises:
   reading data from memory cells connected to the selected word line using a verify voltage;
   determining whether a number of memory cells with threshold voltages reaching a target voltage is greater than a critical value; and
   determining the result of the program verification operation as the pass if the number of memory cells with the threshold voltages reaching the target voltage is greater than the critical value.

2. The method of claim 1,
   wherein the critical value is equal to the number of memory cells connected to the selected word line.

3. The method of claim 1,
   wherein the critical value is previously set and stored in a memory cell array of the semiconductor memory device.

4. A method of operating a semiconductor memory device, the method comprising:
   performing a program voltage application operation to increase threshold voltages of memory cells connected to a selected word line;
   performing a program verification operation to determine whether the threshold voltages of memory cells reach a target voltage level; and
   outputting a status fail signal when a result of the program verification operation is a pass,
   wherein the program voltage application operation comprises applying a program voltage pulse to the selected word line, and
   wherein the program verification operation comprises:
   reading data from memory cells connected to the selected word line using a verify voltage;
   determining whether a number of memory cells with threshold voltages reaching a target voltage is greater than a critical value; and
   determining the result of the program verification operation as the pass if the number of memory cells with the threshold voltages reaching the target voltage is greater than the critical value.

5. The method of claim 4,
   wherein the critical value is equal to the number of memory cells connected to the selected word line.

6. The method of claim 4,
   wherein the critical value is previously set and stored in a memory cell array of the semiconductor memory device.

7. A semiconductor memory device, comprising:
   a memory cell array including a plurality of memory cells; and
   a peripheral circuit configured to perform a program operation including a plurality of program loops on selected memory cells among the plurality of memory cells, wherein each of the plurality of program loops includes a program voltage application operation and a program verification operation; and a control logic configured to control the peripheral circuit to output a status fail signal if a result of the program verification operation for a first program loop among the plurality of program loops is a pass, wherein the control logic controls the peripheral circuit to apply a program voltage pulse to the selected memory cells during the program voltage application operation, wherein the control logic controls the peripheral circuit to read data from the selected memory cells by applying a verify voltage during the program verification operation, and wherein the control logic controls the peripheral circuit to determine whether a number of memory cells with threshold voltages reaching a target voltage is greater than a critical value, and determines the result of the program verification operation as the pass if the number of memory cells with the threshold voltages reaching the target voltage is greater than the critical value.

8. The semiconductor memory device of claim 7, wherein the critical value is previously set and stored in the memory cell array of the semiconductor memory device.

9. The semiconductor memory device of claim 7, wherein the critical value is equal to the number of memory cells connected to a selected word line.

* * * * *